United States Patent [19]

Ikeda et al.

[11] Patent Number: 5,079,611

[45] Date of Patent: Jan. 7, 1992

[54] SEMICONDUCTOR INTEGRATED CIRCUIT DEVICE AND PROCESS FOR FABRICATING THE SAME

[75] Inventors: Shuji Ikeda; Satoshi Meguro; Makoto Motoyoshi; Osamu Minato, all of Tokyo, Japan

[73] Assignee: Hitachi, Ltd., Tokyo, Japan

[21] Appl. No.: 599,455

[22] Filed: Oct. 18, 1990

Related U.S. Application Data

[62] Division of Ser. No. 862,635, May 13, 1986.

[30] Foreign Application Priority Data

May 13, 1985 [JP] Japan .................. 60-99579

[51] Int. Cl.⁵ .......................... H01L 27/02
[52] U.S. Cl. ..................... 357/41; 357/23.4; 357/23.6; 357/23.8; 357/23.12; 357/51; 357/59
[58] Field of Search ............ 357/23.6, 23.8, 23.12, 357/23.4, 41, 46, 51, 59

[56] References Cited

U.S. PATENT DOCUMENTS 4,833,647 5/1989 Maeda et al. .................. 357/23.6

FOREIGN PATENT DOCUMENTS 0141758 6/1987 Japan ...................... 351/23.6

Primary Examiner—Edward J. Wojciechowicz
Attorney, Agent, or Firm—Antonelli, Terry, Stout & Kraus

[57] ABSTRACT

Herein disclosed is a semiconductor integrated circuit device having a SRAM, in which two MISFETs of a flip-flop circuit of a memory cell are connected directly with an n+-type drain region so that they are cross coupled; and in which a p+-type semiconductor region is formed below a direct contact part by making use of the mask used in the step of forming contact holes for the direct contact part. The p+-type semiconductor region aids as a barrier to prevent soft errors of the SRAM due to α-particles.

39 Claims, 10 Drawing Sheets

SEMICONDUCTOR INTEGRATED CIRCUIT DEVICE AND PROCESS FOR FABRICATING THE SAME

This application is a divisional application of application Ser. No. 862,635, filed May 13, 1986.

BACKGROUND OF THE INVENTION

The present invention relates to a semiconductor integrated circuit device and, more particularly, to a technique effective when applied to a static random access memory (i.e., SRAM).

The SRAM is accompanied by a tendency that the quantity of charge to be stored in a storage node of a memory cell is reduced to a lower value in accordance with the higher integration of the SRAM. This makes it feasible to cause the so-called "soft error" in which the stored information of the memory cell is inverted by the action of radiation such as $\alpha$ particles.

We therefore have proposed the following technique in the specification of U.S. patent application Ser. No. 764,208, filed on Aug. 8, 1985: a p$^+$-type semiconductor region is formed partially below an n$^+$-type source or drain region of a MISFET (i.e., Metal Insulator Semiconductor Field Effect Transistor) of a memory cell. According to this technique, a junction capacitance can be raised to increase the quantity of charge as information and to form a potential barrier thereby to prevent invasion of minority carriers established by the $\alpha$ particles. The p$^+$-type semiconductor region is formed like the source or drain region by an ion implantation using the gate electrode of the MISFET as a mask. Then, it is possible to reduce the number of the masking steps for forming the p$^+$-type semiconductor region and to form the same region in self-alignment with the gate.

SUMMARY OF THE INVENTION

Since the gate is used as the mask, according to the above-specified technique, no p$^+$-type semiconductor region is formed below the gate. For cross coupling, there are formed in the memory cell of the SRAM direct contact parts where gate electrodes in direct contact with the n$^+$-type semiconductor region. The p$^+$-type semiconductor region is not formed in those parts.

According to our investigations, the following disadvantage may occur in the aforementioned case. In other words, there is left in the memory cell a part which cannot prevent the invasion of the minority carriers established by the $\alpha$ particles. This problem is prominent in a SRAM having a high integration such as 1 Mbits, in which the ratio of the aforementioned direct contact parts of the memory cell is high. That problem is also prominent in case the gate electrode is in direct contact with the storage node.

An object of the present invention is to provide a technique for improving the reliability of a semiconductor integrated circuit device.

Another object of the present invention is to provide a technique for stably holding the information written in the memory cell of the SRAM and for improving the reliability of the SRAM.

Still another object of the present invention is to provide a technique for preventing the soft error of the SRAM due to the $\alpha$ particles without the fluctuations of the threshold voltage of the MISFET.

A further object of the present invention is to provide a technique for preventing the soft error of the SRAM due to the $\alpha$ particles and for reducing the number of fabrication steps.

The above-specified and other objects and the novel features of the present invention will become apparent from the following description taken with reference to the accompanying drawings.

Representatives of the present invention to be disclosed hereinafter will be briefly described in the following.

A semiconductor region for preventing the invasion of the $\alpha$ particles is formed using a mask for forming direct contact parts.

This can reduce the number of fabrication steps because it makes unnecessary the step of forming the mask for the aforementioned semiconductor regions against the $\alpha$ particles.

Moreover, the soft error due to the $\alpha$ particles can be prevented by forming the direct contact parts with the semiconductor regions against the $\alpha$ particles.

BRIEF DESCRIPTION OF THE INVENTION

Figure 1:
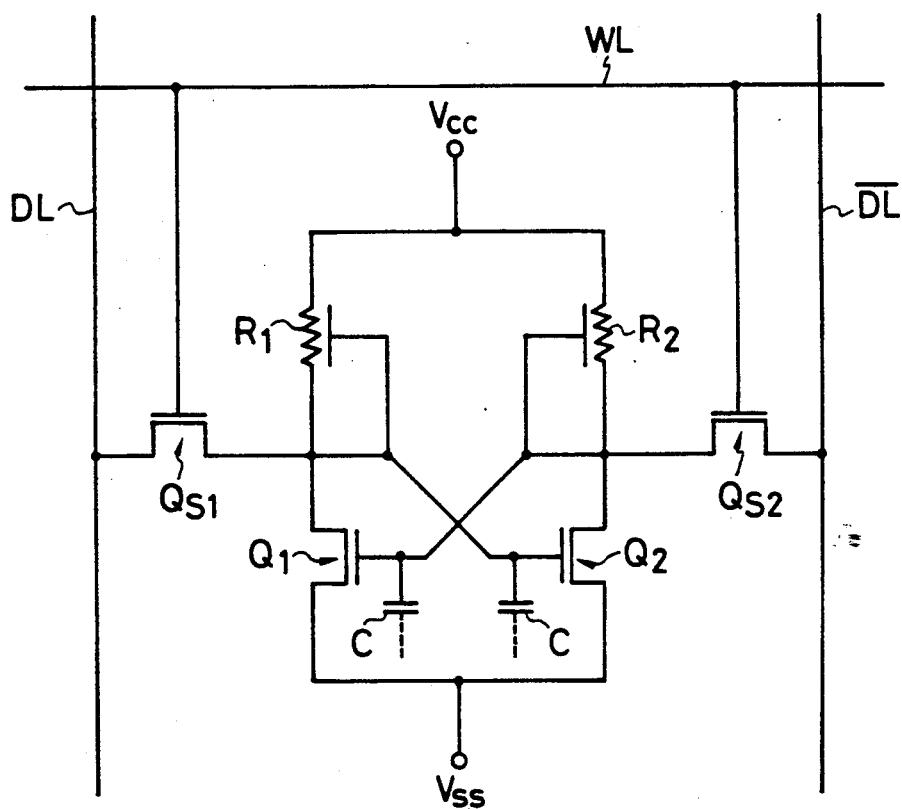
FIG. 1 is a circuit diagram showing a memory cell of a SRAM for explaining one embodiment of the present invention.
Figure 2:
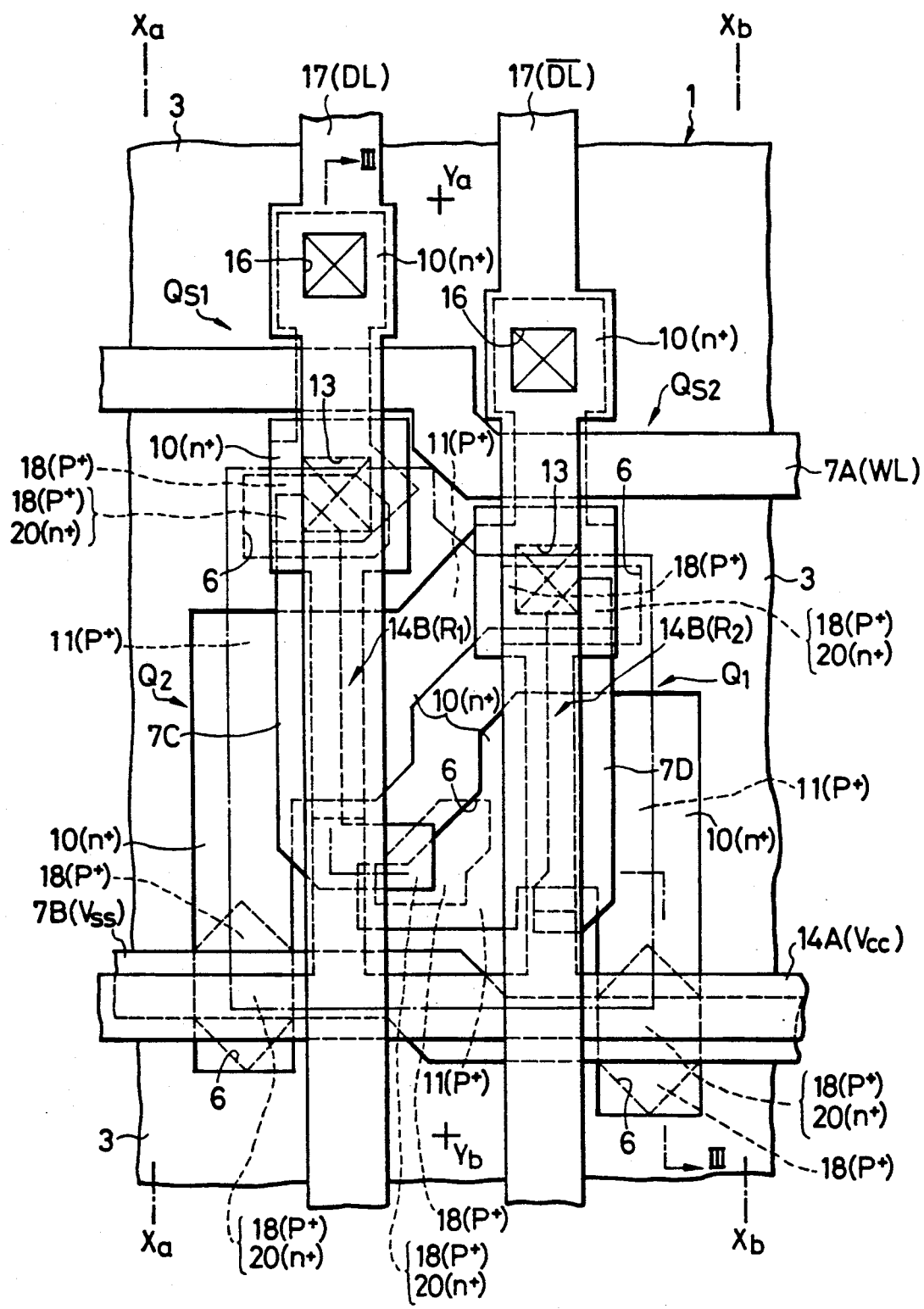
FIG. 2 is a top plan view showing the memory cell of the SRAM for explaining the embodiment of the present invention.
Figure 3:
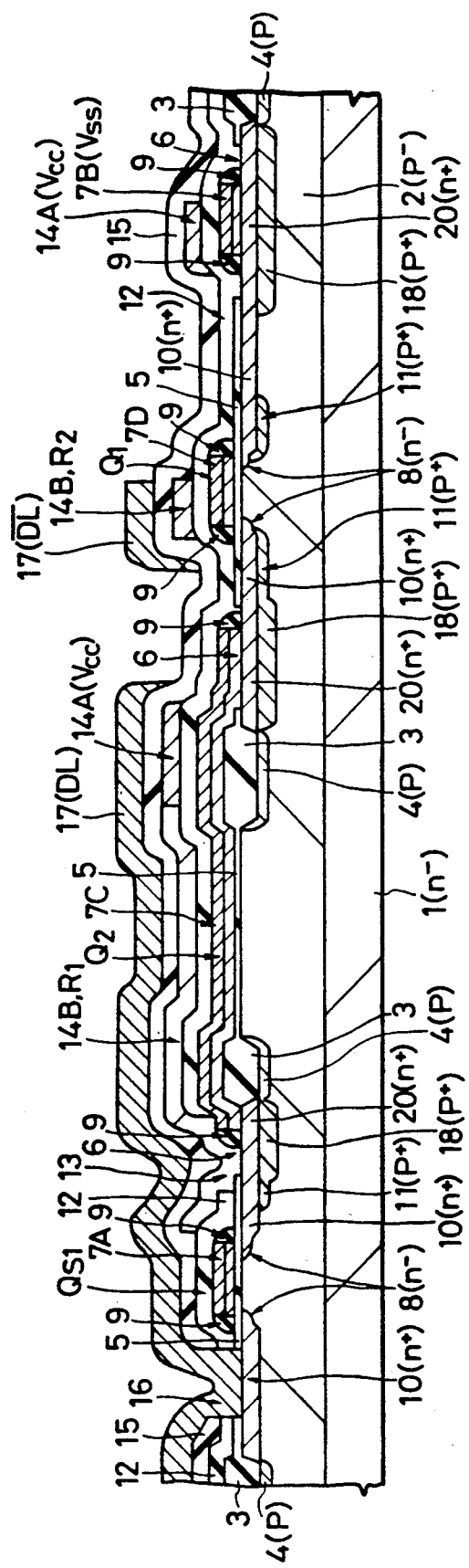
FIG. 3 is a sectional view taken along line III—III of FIG. 2.

In FIGS. 4 to 13 showing the memory cell of the SRAM at the respective fabrication steps for explaining the process for fabricating the SRAM of FIGS. 1 to 3:

FIGS. 4 to 7 are top plan views of the same; and

FIGS. 8 to 13 are sectional views of the same.

DESCRIPTION OF THE PREFERRED EMBODIMENTS

The present invention will be described on an embodiment in case it is applied to a SRAM in which a flip-flop circuit of a memory cell is composed of two resistor elements and two MISFETS. Throughout the drawings, parts having identical functions will be denoted by identical reference characters, and their repeated explanations will be omitted.

FIG. 1 is a circuit diagram showing the memory cell of the SRAM for explaining the embodiment of the present invention.

In FIG. 1, reference letters WL denote a plurality of word lines which are so provided in a column direction as to extend in a row direction (which will be specified for the word lines to extend).

Denoted by letters DL and $\overline{DL}$ are complementary data lines which are so provided in the row direction as to extend in the column direction (which will be specified for the data lines to extend).

Each memory cell of the SRAM is composed of a flip-flop circuit having a pair of input/output terminals, and switch MISFETs $Q_{S1}$ and $Q_{S2}$ connected with the input/output terminals, respectively. Moreover, the plural memory cells are disposed at predetermined crossing parts between the word lines WL and the data lines DL and $\overline{DL}$ to construct a memory cell array.

The switch MISFETs have source or drain regions, one of which is connected with the data lines DL and $\overline{DL}$ and the other of which is connected with the input/output terminals of the aforementioned flip-flop circuit. The switch MISFETs $Q_{S1}$ and $Q_{S2}$ for memory cell selection have their gate electrodes (hereafter simply called gates) connected with the word line WL and are switches controlled by the word line WL to provide selective connection between the flip-flop circuit and the data lines DL and $\overline{DL}$.

The flip-flop circuit is composed of MISFETs Q1 and Q2 and resistor elements $R_1$ and $R_2$. The flip-flop circuit thus composed stores the information "1" or "0" transmitted from the data lines DL and $\overline{DL}$. The flip-flop circuit can be deemed as two cross-coupled inverter circuits. These inverter circuits are composed of the resistor elements $R_1$ and $R_2$ acting as loads and the driving MISFETs $Q_1$ and $Q_2$, respectively. The output of one of the inverter circuits is fed as an input to the gate of the driving MISFET of the other inverter circuit.

The inverter circuits are supplied through the resistor elements $R_1$ and $R_2$, respectively, with a power source potential Vcc. The resistor elements $R_1$ and $R_2$ control the flow rate of the current coming from the power source Vcc to stably hold the information written.

The two inverter circuits are connected through a common wiring with a fixed potential such as the ground potential Vss of the circuit. As a result, the two driving MISFETs have their sources connected with the common ground potential wiring.

In the memory cell, the written information can be so deemed as has been stored in parasitic capacitors C. These parasitic capacitors C are mainly the capacitance of the gates of the MISFETs $Q_1$ and $Q_2$ and junction capacitance between one semiconductor region (e.g., the source or drain region) and a region which is substantially deemed as a substrate. In the present invention, the parasitic capacitors C can be increased while the soft errors are reduced without imposing any influence upon the threshold voltages or the like of the MISFETs $Q_1$ and $Q_2$.

FIG. 2 is a top plan view showing the memory cell of the SRAM of the present invention. FIG. 3 is a sectional view taken along line III—III of FIG. 2. Incidentally, in the top plan views presented by FIG. 2 and FIGS. 4 to 7, any insulating film other than a field insulating film 3 to be formed between individual conductive layers is not shown so that the construction of the present embodiment may be feasibly understood.

In FIGS. 2 and 3, reference numeral 1 denotes a semiconductor substrate which is made of $n^-$-type single crystalline silicon. Denoted by numeral 2 is a $p^-$-type well region which is formed over a prescribed main surface of the semiconductor substrate 1. Denoted by numeral 3 is the field insulating film which is formed over the main surface of the semiconductor substrate 1 and the well region 2. The field insulating film 3 thus formed isolates the semiconductor elements. A p-type channel stopper region 4 is formed in the well region 2 below the field insulating film 3. The channel stopper region 4 thus formed prevents the parasitic MISFET from operating thereby to electrically isolate the semiconductor elements.

In the SRAM of the present embodiment, the memory cell is composed of the n-channel MISFETs $Q_1$, $Q_2$, $Q_{S1}$ and $Q_{S2}$. These n-channel MISFETs $Q_1$, $Q_2$, $Q_{S1}$ and $Q_{S2}$ are formed in the $p^-$-type well region 2. On the other hand, peripheral circuits (e.g., a sense amplifier, a decoder, a timing signal generator or an input/output circuit) are constructed, although not shown, of complementary MIS circuits. The n-channel and p-channel MISFETs composing the complementary MIS circuits are formed in the $p^-$-type well region and the $n^-$-type semiconductor substrate 1, respectively. These individual MISFETs are so substantially surrounded by the field insulating film as have their shapes defined. In other words, the MISFETs are formed in the region (i.e. the active region) where the field insulating film 3 is not formed.

Each of the switch MISFETs $Q_{S1}$ and $Q_{S2}$ comprises an insulating film 5 acting as the gate insulating film, a conductive layer 7A acting as the gate, and $n^-$-type and $n^+$-type semiconductor regions 8, 10 and 20 acting as the source-drain regions. The MISFET $Q_1$ comprises the insulating film 5 acting as the gate insulating film, a conductive layer 7D acting as the gate, and the $n^-$-type and $n^+$-type semiconductor regions 8, 10 and 20 acting as the source-drain regions. The MISFET $Q_2$ comprises the insulating film 5 acting as the gate insulating film, a conductive layer 7C acting as the gate, and the $n^-$-type and $n^+$-type semiconductor regions 8, 10 and 20 acting as the source-drain regions.

The gate insulating film 5 is made of the silicon dioxide film which is formed over the main surface of the active region of the semiconductor substrate 1 and the well region 2.

Each of the gates 7A, 7C and 7D is constructed of a two-layered film (having a polycide structure), which is composed of a polycrystalline film and a silicide film formed over the former and made of a compound of silicon and refractory metal (e.g., molybdenum, tantalum, titanium or tangsten). Alternatively, the conductive layers 7A, 7C and 7D may be formed of a silicide film and a refractory metal film. The gate 7A is extended in the row direction over the field insulating film 3. In other words, the conductive layer 7A is used as the word line WL. The shapes of the gates 7A, 7C and 7D may be referred to FIG. 6.

The source-drain regions are made to have the so-called "LDD (i.e., LIghtly Doped Drain) structure" by the semiconductor regions 8 and 10. In order to make this LDD structure, the insulating film 9 is formed at the two sides of and in self-alignment with the conductive layers 7A to 7D. The mask 9 may be removed after the $n^+$-type semiconductor region 10 and the $p^+$-type semiconductor region 11 have been formed. The semiconductor region 8 is made to have a lower impurity concentration than that of the semiconductor region 10. This can damp the intensity of the electric field-of the pn junction between the semiconductor region 8 and the well region. In order to connect the gates 7B to 7D and the semiconductor region 10, the $n^+$-type semiconductor region 20 is formed below the gates 7B to 7D other than formed over the field insulating film 3.

In order to effect the cross coupling of the two inverters, the gates 7C and 7D are used for the wiring.

The conductive layer 7C acting as the gate of the MISFET $Q_2$ has its one end connected directly with the semiconductor region (i.e., the source-drain region) 20 of the MISFET $Q_{S1}$ through a contact hole 6 formed in the insulating film 5 and its other end connected directly with the semiconductor region (i.e., the source-drain) region 20 of the other MISFET $Q_1$ through the contact hole 6. The conductive layer 7C thus connected provides the wiring for connecting the gate of the MISFET $Q_2$ and the source-drain regions of the MISFETs $Q_{S1}$ and $Q_1$ and the wiring for connecting the MISFETs $Q_1$ and $Q_{S1}$. The conductive layer 7D has its one end connected through the contact hole 6 with the semiconductor region (i.e., the source-drain region) 20 of the MISFET $Q_{S2}$. The conductive layer 7D thus connected provides the wiring for connecting the gate of the MISFET $Q_1$ and the source-drain region of the MISFET $Q_{S2}$.

The cross coupling of the two inverter circuits is realized without obstructing the improvement in the integration. As the wiring for the cross coupling, more specifically, there are used the semiconductor regions 10 (and 8) defined by the field insulating film 3 and the gates 7C and 7D. Neither the wiring especially for the cross coupling nor the are for the connection is required.

Incidentally, the source-drain regions of the MISFETs $Q_{S2}$ and $Q_2$ may be connected by making the shape of the gate 7D similar to that of the gate 7C. The conductive layer 7C (or 7D) can be used as the wiring for connecting the MISFETs because its resistance is as small as several $\Omega/\square$.

The two driving MISFETs $Q_1$ and $Q_2$ have their sources supplied with the ground potential Vss ($=0$ V) of the circuit through the conductive layer 7B. This conductive layer 7B is formed of the same material as that of the conductive layers 7A, 7C and 7D and at the common step so that it has a resistance as small as several $\Omega/\square$.

Figure 6:
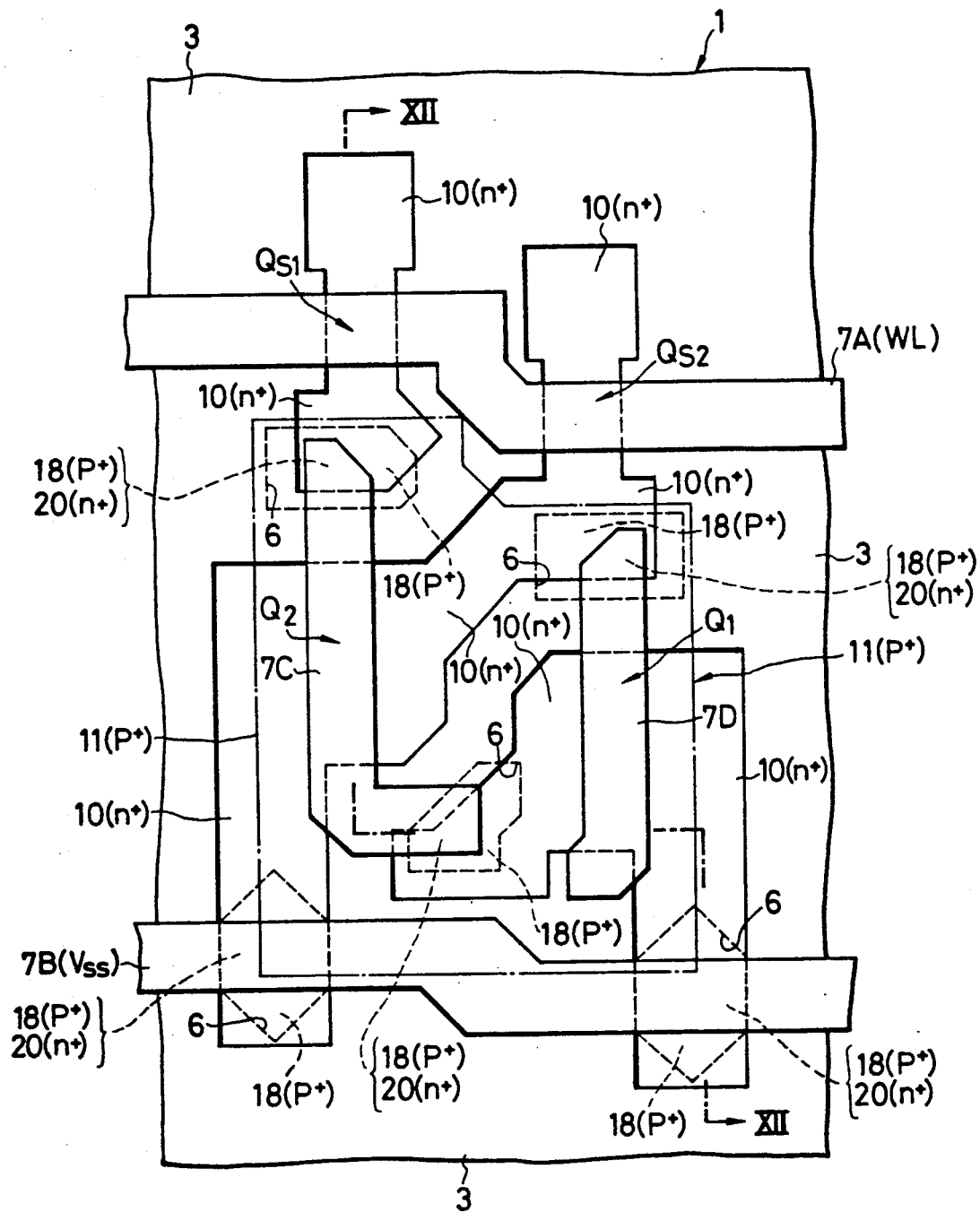

The conductive layer 7B is connected through the contact hole 6 directly with the source regions 20 of the MISFETs $Q_1$ and $Q_2$. The conductive layer 7B is formed to extend in the row direction generally in parallel with the conductive layer 7A over the field insulating film 3. The conductive layer 7B provides the ground potential wire which is shared among the plural memory cells arranged in the row direction. The source regions of the MISFETs $Q_1$ and $Q_2$ are made larger than the drain regions only at the parts used for their connection with the conductive layer 7B. Specifically, the source regions are made longer in the extending directions of the gates 7C and 7D, as shown in FIG. 6, than the drain regions. As a result, the conductive layer 7B can be freed from dropping the integration and overlapping on the conductive layers 7C and 7D and can be made generally straight.

In order to prevent the soft error and to increase the parasitic capacitance of the storing node of the memory cell, there are formed p+-type semiconductor regions 11 and 18.

The semiconductor region 11 is formed in contact with the semiconductor region 10. More specifically, the semiconductor region 11 is formed below the two semiconductor regions 10 of the MISFETs $Q_1$ and $Q_2$ and below the semiconductor region 10 of one of the MISFETs $Q_{S1}$ and $Q_{S2}$ (i.e., the part enclosed by single-dotted lines 11 in FIG. 2). In other words, the semiconductor region 11 is formed in such a part as to contribute to augmentation of the parasitic capacitance C of the information storing node (i.e, the output node of the inverter) of the memory cell. Since the semiconductor regions 11 and 10 to form the pn junction together have high impurity concentrations, the junction capacitance can be augmented. This makes it possible to prevent the soft error due to the α particles. The semiconductor region 11 is made to have a higher impurity concentration than that of the well region 2. As a result, a barrier for suppressing the invasion of the minority carriers to be established in the well region 2 by the α particles can be formed to further prevent the soft error.

As will be described in detail hereinafter, the semiconductor region 11 is formed by introducing the impurity by the ion implantation using the gate electrodes 7C and 7D and the mask 9. As a result, the semiconductor region 11 is constructed not to reach the region, in which the channel is to be formed, so that it exerts no influence upon the threshold voltages of the MISFETs $Q_1$ and $Q_2$. No masking allowance for forming the semiconductor region 11 can be required to improve the integration.

The impurity (e.g., boron ions) composing the semiconductor region 11 has a larger diffusion coefficient than that of the impurity (e.g., arsenic ions) composing the semiconductor region 10. Since the ions of the two impurities are implanted using a common mask, the semiconductor region 11 is formed along or around the semiconductor region 10. This formation can augment the pn junction area between the semiconductor regions 11 and 10. The semiconductor region 11 is formed below the semiconductor region 8, too, by the difference in the diffusion rate. This makes it possible to prevent the coupling (i.e., the punch-through) of a depletion region between the two semiconductor region 10 as the source region and the drain region. As a result, the short-channel effect can be reduced.

The semiconductor region 11 may be used merely for enhancing the action of the barrier against the minority carriers. In this case, the semiconductor region 11 can be formed in a deeper part apart from the semiconductor region 10.

This semiconductor region 10 may be formed by using the conductive layers 7A to 7C as a mask whereas the semiconductor region 11 ma be formed by using the conductive layers 7A to 7C as the impurity introducing mask 9, but the semiconductor region B may not be formed.

The semiconductor region 11 is not formed below the electrodes 7C and 7D, namely, in the region (i.e., the direct contact part) in which the electrodes 7C and 7D contact directly with the region 20. In order to compensate this, the p+-type region 18 is formed in the direct contact part. This semiconductor region 18 is formed by introducing an impurity into the substrate through the contact hole 6, although its detail will be described hereinafter. The semiconductor region 18 thus formed has substantially the same impurity concentration as that of the semiconductor region 11, for example, and is integral with the semiconductor region 11 at some part.

Thanks to the semiconductor region 18, the soft error caused by the α particles can be prevented even at the direct contact part. The semiconductor region 18 exerts no influence upon the threshold voltage of the MISFET because it is formed apart from the channel part of the MISFET of the memory cell. As will be described hereinafter, neither a new mask for forming the semiconductor region 18 nor a masking allowance is required.

Incidentally, the semiconductor region 18 is formed in the direct contact part of the wiring 7B, too. Since this wiring 7B provides a fixed potential line, the operation speed is not dropped by the increase in the junction capacitance. Since the wiring 7B (and the region 20) is at the same potential as that of the well region 2, moreover, it is unnecessary to consider the breakdown voltage of the pn junction between the region 20 (and the region 10) and the region 18.

The area of the memory cell is reduced by conducting the cross coupling by the gates 7C and 7D. The memory cell area is further reduced by connecting the gates 7C and 7D directly with the semiconductor region 20. The regions 11 and 18 are formed so as not to deteriorate the area reducing effect. The former region 11 is formed by using as a mask the gates 7C and 7D formed as described above. In order to compensate the region 11 which is not formed in the direct contact part, the latter region 18 is formed in the direct contact part. This region 18 is formed by making use of the contact hole 6 for the direct contact. A portion of the direct contact part, i.e., a portion except the portion of the direct contact part for connecting the wiring 7B and the region 20 is formed at the storage node of the memory cell. Thanks to the region 18, the invasion of the minority carriers can be prevented even at the direct contact part of the storage node. In the SRAM having a high integration equal to or higher than 1 Mbits, the area of the direct contact part becomes the larger relative to the area of the storage node as the cell area becomes the smaller. Since the region 18 is formed by making use of the contact hole 6, it does not require any masking allowance especially for forming it. As a result, the reduction in the are of the memory cell is not obstructed. The technique for forming those regions 11 and 18 is suitable for the finer structure of the memory cell.

An insulating film 12 is formed to cover the MISFETs $Q_1$, $Q_2$, $Q_{S1}$ and $Q_{S2}$. This insulating film 12 is made of silicon oxide. On the insulating film 12, there are formed the resistor elements $R_1$ and $R_2$ and the wiring for applying the power source voltage Vcc to the resistor elements. These resistor elements $R_1$ and $R_2$ and the wiring are made of a polycrystalline silicon layer 14 formed on the insulating film 12. The polycrystalline silicon layer 14 is composed of a part (i.e., a conductive layer) 14A, which is doped with an impurity to have a lower resistance, and a part 14B which is not doped with any impurity to have a higher resistance. More specifically, the impurity such as arsenic is introduced into a part other than the part 14B which is enclosed by single-dotted lines shown in FIGS. 7.

The conductive layer 14A is superposed on the conductive layer 7B (i.e., the ground potential wiring) and is extended in the row line on the insulating film 12. Thus, the conductive layer 14A provides the lines which are connected with the memory cells arranged in the row direction, respectively, for applying thereto the power source voltage.

The undoped part 14B is used as the resistor elements $R_1$ and $R_2$. Each of these resistor elements $R_1$ and $R_2$ has its one end connected with the wiring 14A for the power supply. The other end of the resistor element $R_1$ is connected with the source or drain region 10 of the MISFET $Q_{S1}$ through the contact hole 6 and a contact hole 13 formed in the insulating film 12. The other end of the resistor $R_1$ is connected with the gate 7C of the MISFET $Q_2$ through the contact hole 13. The other end of the resistor element $R_1$ is connected with the source or drain region 10 of the MISFET $Q_1$ through the gate 7C. The other end of the resistor $R_2$ is connected with the gate 7D of the MISFET $Q_1$ through the contact hole 13. Moreover, the other end of the resistor $R_2$ is connected with the common source or drain region 10 of the MISFETs $Q_{S2}$ and $Q_2$ through the contact holes 6 and 13.

Since the gates 7C and 7D are formed to have the above-specified shapes, the resistor elements $R_1$ and $R_2$ can have all their necessary connections completed merely by connecting them with the gates 7C and 7D. This will become more apparent with reference to FIG. 7. Thanks to the aforementioned shapes of the gates 7C and 7D, moreover, the wiring such as the cross coupling of the flip-flop circuit need not be made by using the polysilicon layer 14. This makes it possible to make the resistor element 14B sufficient long between the conductive layer 14A and the contact hole 13.

The resistor element 14B can have its resistance augmented because it is made sufficiently long. As a result, the stand-by current to flow from the resistor element 14B can be reduced for holding the information. Thanks to the sufficient length of the resistor element 14B, it is possible to prevent the coupling (or the punch-through) of the depletion region to be formed in the resistor element 14B from the junction among the resistor element 14B, the semiconductor region 10 and the conductive layers 7C and 7D. An insulating film 15 is formed over the conductive layer 14A and the resistor element 14B. The insulating film 15 electrically isolates the conductive layer 14A and the resistor element 14B from a conductive layer 17 formed thereover. This conductive layer 17 is electrically connected with the prescribed semiconductor region 10 through a contact hole 16 to extend in the column direction over the insulating film 15 across the conductive layers 7A, 7B and 14B and to be superposed on the conductive layers 7C and 7D and the resistor element 14B. The conductive layer 17 is used for providing the data lines DL and $\overline{DL}$. By superposing the conductive layers 7C and 17 and the resistor element 14B, or the conductive layers 7D and 17 and the resistor element 14B, moreover, the planar area can be reduced to improve the integration of the SRAM.

At the lefthand (or righthand) neighborhood of the memory cell, as viewed from FIG. 2, there is arranged a memory cell which is symmetric with respect to a line Xa—Xa (or Xb—Xb). A number of units each composed of those two memory cells are arranged in the row direction. At the upper (or lower) neighborhood of each of those memory cells, as viewed from FIG. 2, there is arranged a memory cell which is symmetric with respect to a point Ya (or Yb). A number of units each composed of those additional two memory cells are arranged in the column direction.

Figure 8:
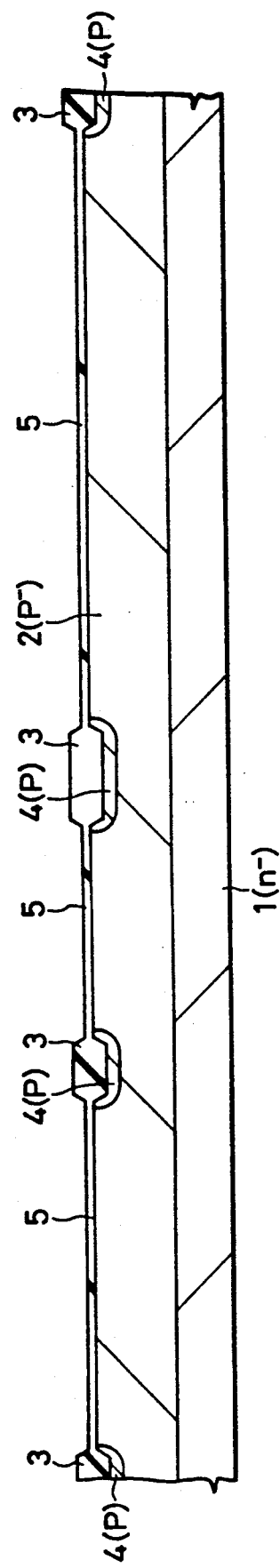
Figure 9:
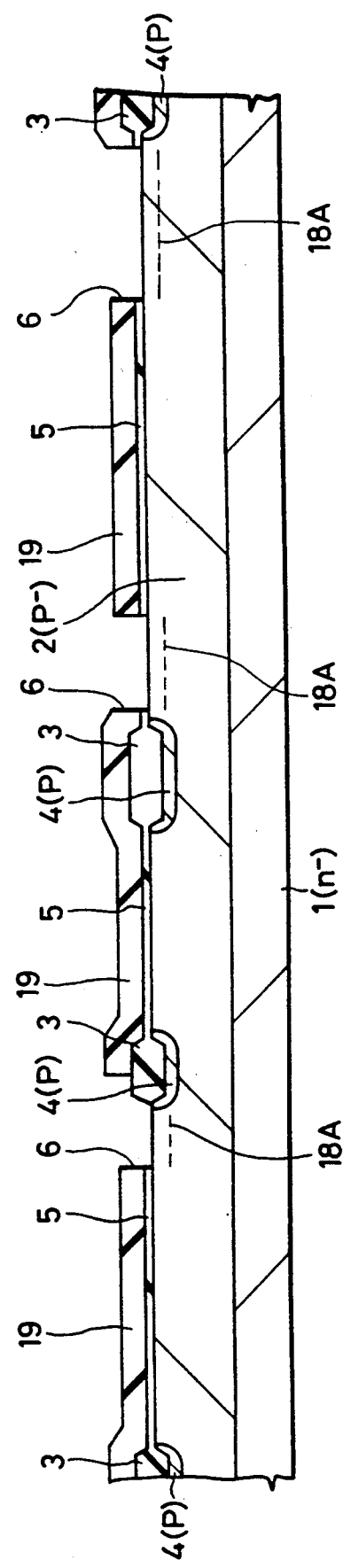
Figure 12:
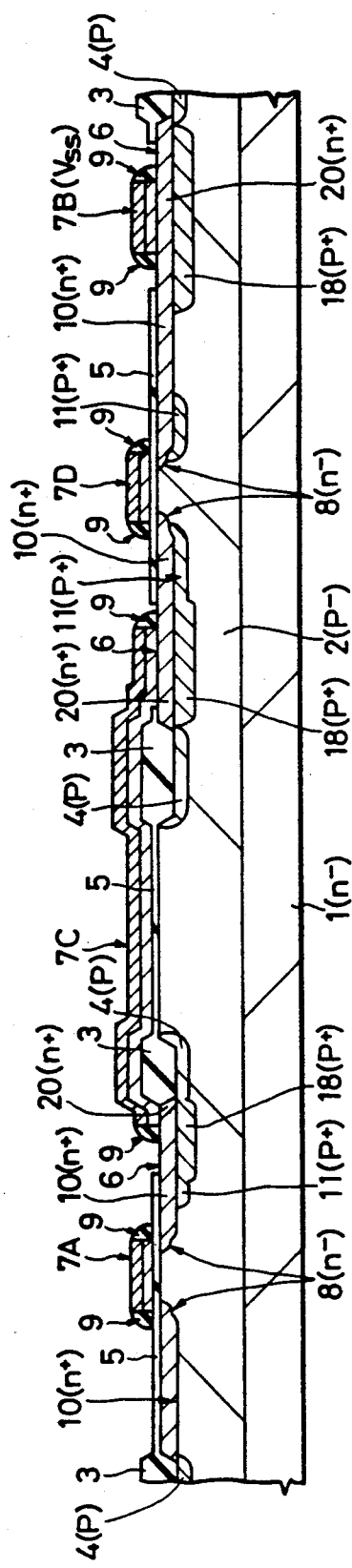
Figure 13:
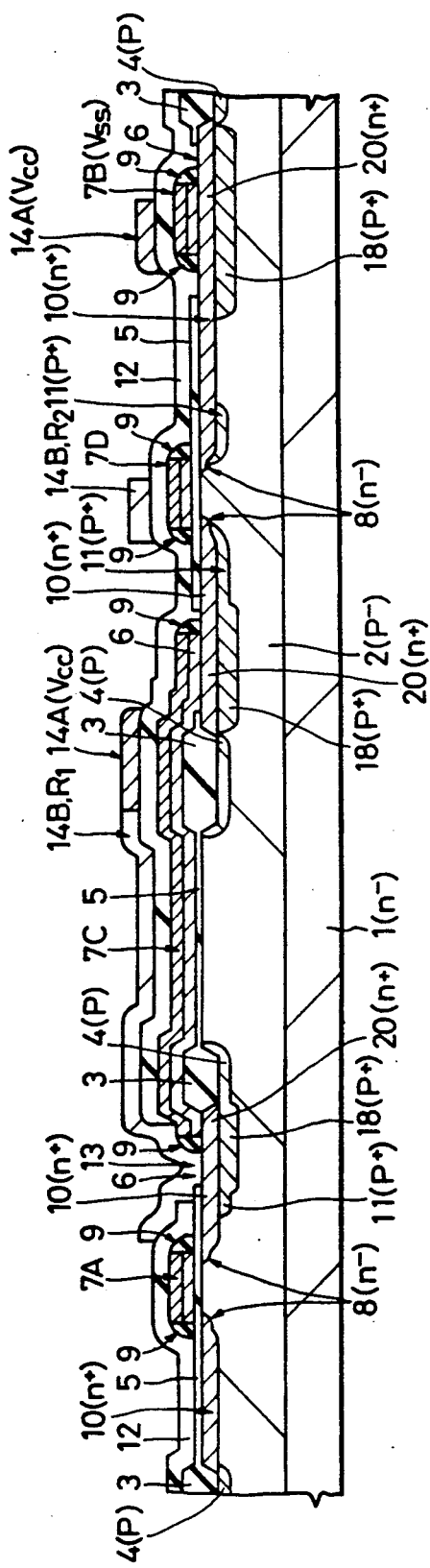

Next, the fabrication process of the present embodiment will be described in the following. FIGS. 4 to 13 are views for explaining the process for fabricating the SRAM shown in FIGS. 2 and 3. FIGS. 4 to 7 are top plan views showing the memory cell of the SRAM at the individual fabrication steps, and FIGS. 8 to 13 are sectional views of the same. Incidentally: FIG. 8 is a section taken along line VIII—VIII of FIG. 4; FIG. 9 is a section taken along line IX—IX of FIG. 5; FIG. 12 is a section taken along line XII—XII of FIG. 6; and FIG. 13 is a section taken along line XIII—XIII of FIG. 7.

Figure 4:
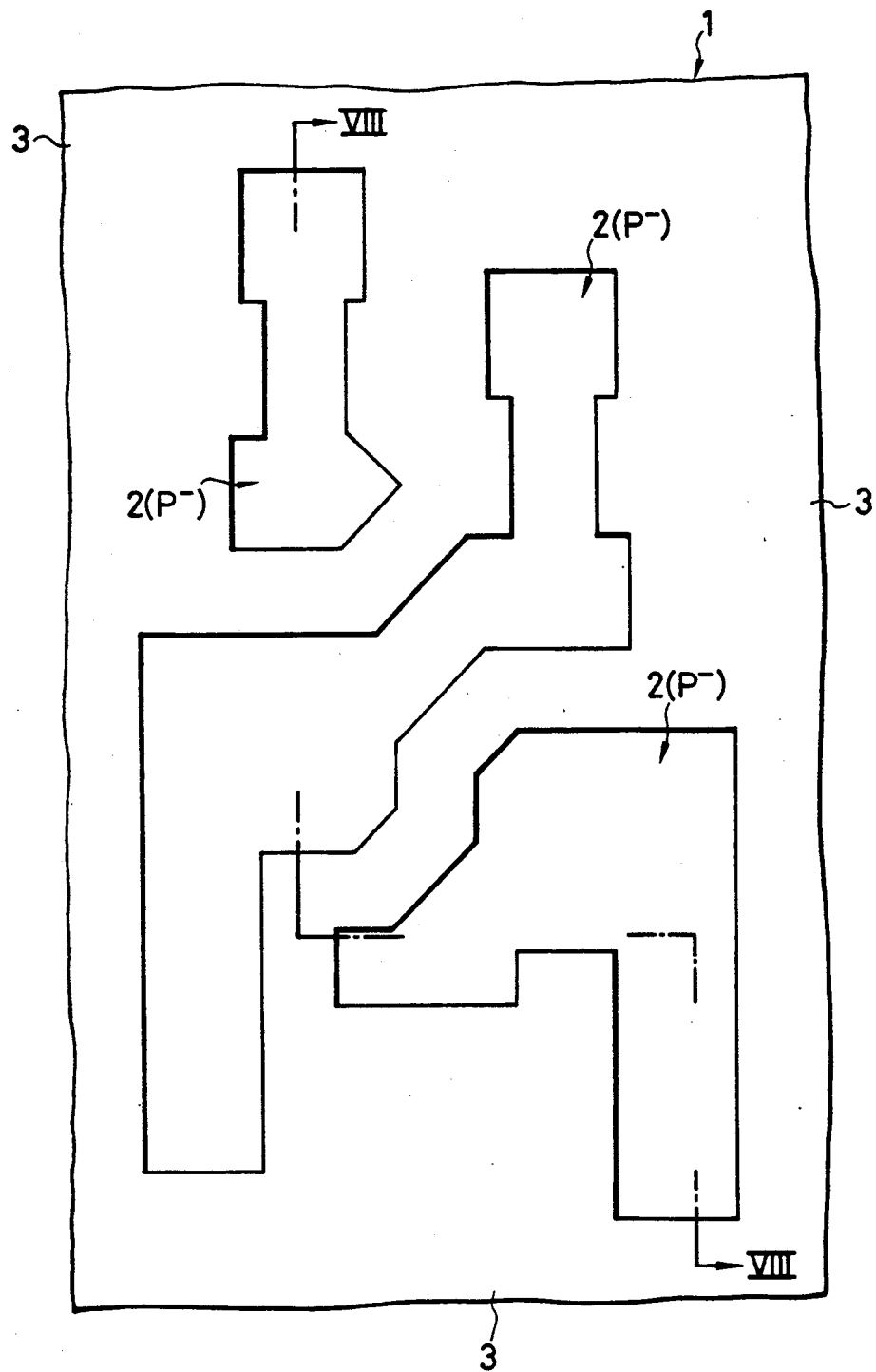

First of all, the $n^-$-type semiconductor substrate 1 made of single crystal silicon is prepared. The $p^-$-type well regions 2 are formed in prescribed parts of the main surface of that semiconductor substrate 1, as shown in FIGS. 4 and 8. The well regions 2 are formed by implanting $BF_2$ ions in a dosage of $2 \times 10^{12}$ [atoms/cm$^2$], for example, with an energy of 60 [KeV], and by diffusing them.

The field insulating films 3 are formed in prescribed parts of the semiconductor substrate 1 and the well regions 2. Moreover, the p-type channel stopper regions 4 are formed in prescribed parts of the well regions 2. The field insulating films 3 are made of a silicon oxide film prepared by a selective thermal oxidation technique. The channel stopper regions 4 are formed by introducing BF$_2$ ions in a dosage of $3 \times 10^{13}$ [atoms/cm$^2$], for example, with an energy of 60 [KeV] and by annealing them at the step of forming the field insulating films 3.

Next, as shown in FIG. 8, the insulating film 5 is formed on the main surface of the semiconductor substrate 1 and the well regions 2 for forming the semiconductor element. The insulating film 5 is made of a silicon oxide film which is prepared by thermal oxidation to have a thickness of 200 to 300 [Å]. The insulating film 5 thus formed is used as the gate insulating film of the MISFET.

Figure 5:
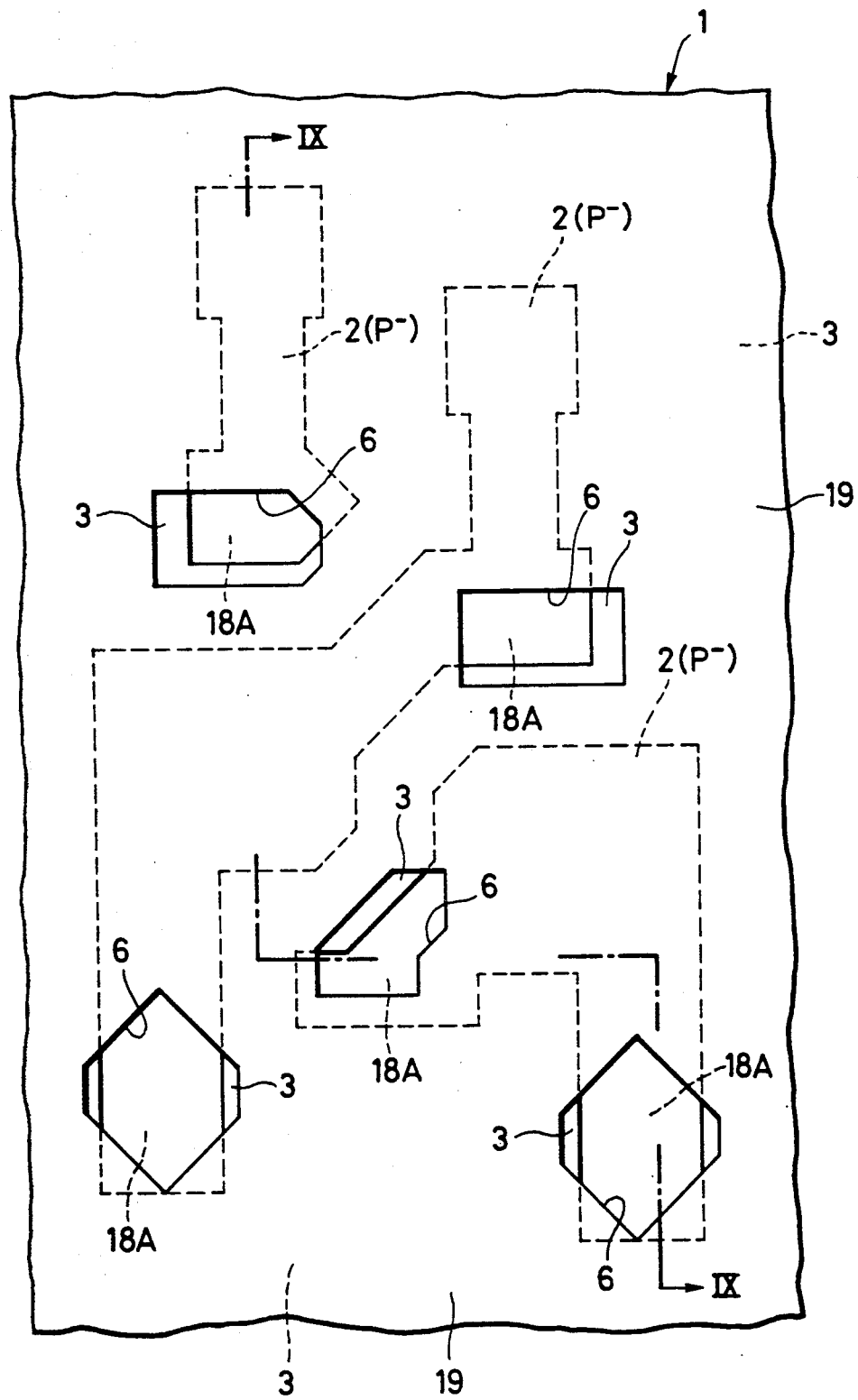

Next, a mask 19 for forming the direct contact holes 6 is formed, as shown in FIGS. 5 and 9. The mask 19 is made of a photo resist film, for example. A p-type impurity 18A is introduced relatively deep into the well regions 2 through insulating film 5 by the ion implantation using the mask 19. The p-type impurity such as boron is introduced by ion implantation in a dosage of 10$^{13}$ [atoms/cm$^2$] with an energy of 100 to 125 [KeV]. By the introduction of the boron 18A using the direct contact mask 19, the number of the fabrication steps can be reduced. Since the ion implantation is conducted through the insulating film 5, moreover, it is possible to avoid the damage of the main surface of the substrate 1. This ensures satisfactory connections between the conductive layers 7 (i.e., 7B to 7D) and the semiconductor region 20. Next, the mask 19 is used to remove the insulating film 5 exposed therefrom thereby to form the direct contact holes 6. Then, the mask 19 is removed.

Figure 10:
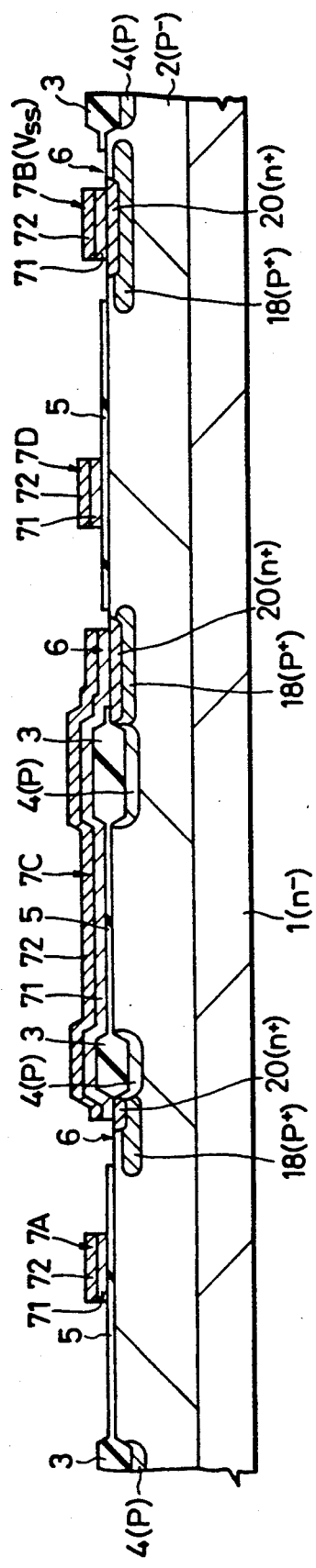

The conductive layers 7A to 7D are formed over the field insulating film 3 and the insulating film 5, as shown in FIGS. 6 and 10. The conductive layers 7B to 7D thus formed are connected with the main surface of the prescribed well regions 2 through the contact holes 6. Each of the conductive layers 7A to 7D is made of two films i.e. a polycrystalline silicon film 71 which is formed by CVD (i.e., Chemical Vapor Deposition) and doped with phosphorous to have its resistance lowered, and a molybdenum silicide film 72 which is formed over the polycrystalline silicon film 71 by sputtering. The polycrystalline silicon film 71 is made to have a thickness of about 2,000 [Å], for example, whereas the molybdenum silicide film 72 is made to have a thickness of about 3,000 [Å], for example. The conductive layers 7A to 7D can be made to have a resistance of several [Ω/□] because it contains the molybdenum silicide 71.

The phosphorous introduced into the polycrystalline silicon film 71 is diffused into the well regions 2, which are connected with the conductive layer 7B. 7C or 7D through the contact hole 6, to form the n$^+$-type semiconductor region 20. On the other hand, the boron 18A implanted is activated to form the p$^+$-type semiconductor region 18. The phosphorous introduction and the boron activation are carried out by the heat (at 700° C. to 1,000° C.) of the CVD for forming the polycrystalline silicon film 71, for example.

At the direct contact part, the phosphorous introduced into the polycrystalline silicon film 71 for lowering the resistance will diffuse deep into the well regions 2. As a result, the semiconductor region 18 partially has its conductivity type turned to the n-type. However, the semiconductor region 18 is formed so deep that its entirety may not be turned to the n-type by the semiconductor region 20.

By introducing arsenic having a small diffusion constant into the polycrysalline silicon, the semiconductor region 18 may be suppressed from being turned to the n-type. In this case, however, care should be taken not to invite any disconnection because the semiconductor region 20 has a shallow junction. This is because the polycrystalline silicon film 71 and the semiconductor substrate 1 have substantially equal etching rates so that the substrate 1 is etched at the patterning step of the polycrystalline silicon film 71. However, this problem should not be considered in case the phosphorous is introduced into the polycrystalline silicon film 71 and the boron is implanted deep into the substrate 1, as in the present embodiment.

Figure 11:
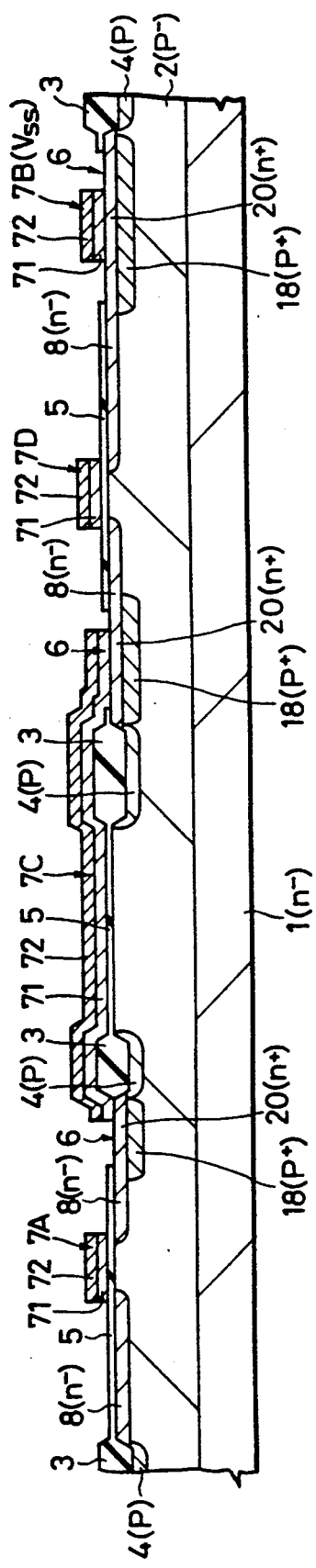

Next, as shown in FIG. 11, the n$^-$-type semiconductor region 8 is formed in the main surface of the well regions 2 at the two sides of the conductive layers 7A, 7C and 7D through the insulating film 5 so as to construct the LDD structure. By using the conductive layers 7A, 7C and 7D and the field insulating film 3 as a mask for the impurity introduction, phosphorous ions are implanted in a dosage of about $1 \times 10^{13}$ [atoms/cm$^2$], for example, with an energy of 50 [KeV]. After this, the semiconductor region 8 is formed by the annealing.

After the semiconductor region 8 has been formed, impurity introducing masks 9 are formed at the two sides of the conductive layers 7A and 7D, as shown in FIG. 12. These impurity introducing masks 9 are prepared, for example, by forming a silicon oxide film all over the substrate by CVD and by subjecting the silicon oxide film to reactive ion etching. Thus, masks 9 are insulating films which are formed in self-alignment with the conductive layers 7A to 7D.

By using the impurity introducing masks 9 and the conductive layers 7A to 7D as the ion implanting masks, as shown in FIGS. 6 and 12, the n$^+$-type semiconductor regions 10 are formed in the prescribed main surface of the well regions 2. The semiconductor regions 10 thus formed provide the source or drain regions of the MISFETs. For example, arsenic ions are implanted in a dosage of about $1 \times 10^{16}$ [atoms/cm$^2$] with an energy of about 80 [KeV], and are then annealed.

After this, a mask is formed to form the p$^+$-type semiconductor region 11 for mainly preventing the soft error. This mask covers the part except the region which is surrounded by the single-dotted lines 11 of FIG. 6. With the mask thus formed, ion implantation is conducted by using the masks 9 and the conductive layers 7C and 7D as the masks. As a result, the p$^+$-type semiconductor region 11 is formed below the prescribed semiconductor region 10, as shown in FIGS. 6 and 12. For example, boron ions are implanted in a dosage of about $1 \times 10^{13}$ [atoms/cm$^2$] with an energy of about 50 [KeV], followed by an annealing. In FIG. 6, the impurity for forming the semiconductor region 11 is introduced through the insulating film 5 into the region which is surrounded by the single-dotted lines 11.

The conductive layers 7A to 7D and the semiconductor regions 8 and 10 are formed at the same fabrication step as that for forming the MISFETs constructing the peripheral circuit. On the other hand, the semiconductor region 11 may be formed below the prescribed n$^+$-type semiconductor region, e.g., below the source and drain regions of the MISFETs constructing an input protecting circuit.

After the step of forming the semiconductor region 11, the insulating film 12 is formed, as shown in FIG. 13. This insulating film 12 is made of a silicon oxide film which is formed to have a thickness of about 1,000 to 2,000 [Å] by CVD, for example. Then, the contact hole 13 is formed by removing the insulating film 12 lying over the prescribed conductive layers 7C and 7D and the semiconductor region 10.

After this, the polycrystalline silicon film 14 to be connected with the prescribed semiconductor region 10 through the contact hole 13 is formed so as to form the power supply voltage wiring 14A and the resistor element 14B. The polycrystalline silicon film 14 may be formed to have a thickness of about 1,000 to 2,000 [Å] by CVD, for example. An impurity for lowering the resistance is introduced into the polycrystalline silicon film for the power supply voltage wiring 14A other than the region for forming the resistor element 14B. Phosphorous is used as the impurity and is introduced by ion implantation, followed by an annealing. The controllability of the resistance is excellent because the impurity is introduced by ion implantation. Because of the use of the ion implantation, moreover, the impurity flowing around to below the impurity introduction mask is a little. This makes it possible to reduce the working size allowability and to make the resistor element 14B sufficiently long.

Figure 7:
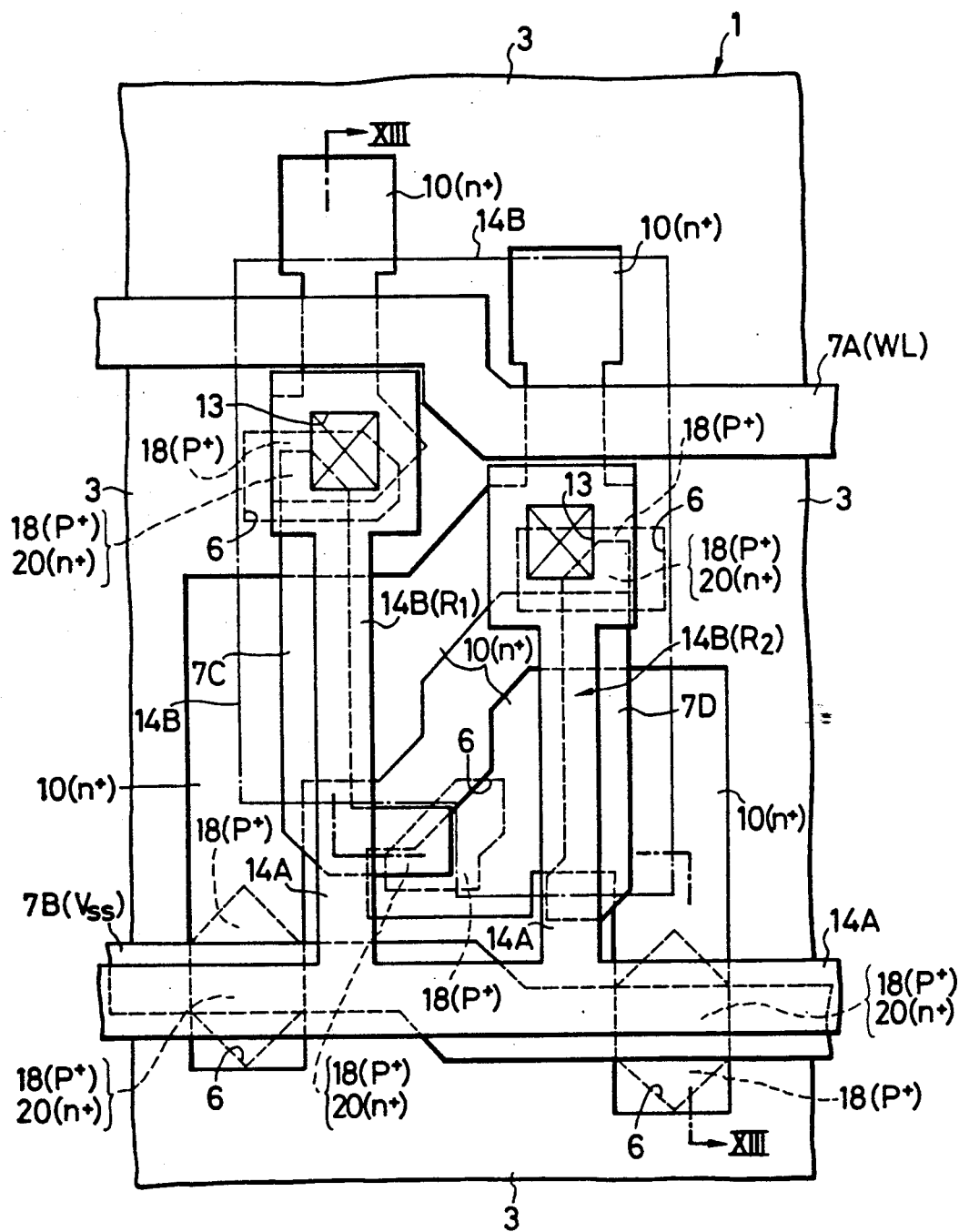

After this, as shown in FIGS. 7 and 13, the aforementioned polycrystalline silicon film is patterned to form the conductive layer 14A to be used as the power source voltage wiring and the resistor element 14B to be used as the resistor elements $R_1$ and $R_2$. The impurity to be introduced for forming the conductive layer 14A will diffuse into the polycrystalline silicon film other than the region which is surrounded by the single-dotted lines 14B of FIG. 7.

After the step of forming the conductive layer 14A and the resistor element 14B, the insulating film 15 is formed. This insulating film 15 is made of a silicon oxide film which is formed to have a thickness of about 3,000 to 4,000 [Å] by CVD, for example. The insulating films 5, 12 and 15 lying over the prescribed semiconductor region 10 are removed to form the contact hole 16.

After this, as shown in FIGS. 2 and 3, the conductive layer 17 is formed, which is electrically connected with the prescribed semiconductor region 10 through the contact hole 16. The conductive layer 17 extends over the insulating film 15 in the column direction to cross the conductive layer 7A. The conductive layer 17 is made of an aluminum film which is formed by sputtering, for example.

After this, a step of forming a passivation film is added. The SRAM of the present embodiment is completed by a series of those fabrication steps.

Although our invention has been specifically described hereinbefore in connection with the foregoing embodiment, it should not be limited thereto but can naturally be modified in various manners without departing from the scope of the appended claims.

For example, the semiconductor region 11 may be omitted. A P-channel MISFET may be used as the load element of the flip-flop circuit of the memory cell. The layout of an N-channel MISFET of the memory cell ma be altered. The ion implantation for forming the semiconductor region 18 may be conducted after the contact hole 6 has been formed in the insulating film 5. The impurity for forming the semiconductor region 18 may be introduced by the thermal diffusion after the contact hole 6 has been formed. The semiconductor region 20 may be formed by a selective ion implantation or diffusion before the conductive layers 7 (i.e., 7A to 7D) are formed. In this case, phosphorous or arsenic may be used as the impurity, and a refractory metal (e.g., Mo, Ta, Ti or W) or its silicide layer may be used as the conductive layers 7 so that the semiconductor region 18 can be formed in a shallow position. The semiconductor region 11 can have its shape altered in various manners.

The present invention is effective not only for the SRAM but also for a variety of semiconductor integrated circuit devices having the direct contact parts.

What is claimed is:

1. A semiconductor integrated circuit device comprising:

a first semiconductor region of first conductivity type formed in a semiconductor substrate;

first and second MISFETs formed in said first semiconductor region and each having a gate insulating film, a gate, and source and drain regions of second conductivity type, the gates of said first and second MISFETs being connected directly with the drain regions of said second and first MISFETs, respectively, through contact holes formed in said gate insulating films thereby to construct a flip-flop circuit of a memory cell; and second semiconductor regions of the first conductivity type formed beneath a first portion of said drain regions to have substantially the same shapes as those of said contact holes and having a higher impurity concentration than that of said first semiconductor region.

2. A semiconductor integrated circuit device according to claim 1, wherein said first and second conductivity types are p-type and n-type, respectively, wherein the semiconductor substrate is of n-type conductivity, and wherein said first semiconductor region is a p-type well region formed in the n-type semiconductor substrate.

3. A semiconductor integrated circuit device according to claim 1, further comprising two resistor elements connected between the drain regions of said first and second MISFETs, respectively, and a power source potential for providing load elements of the flip-flop circuit of said memory cell.

4. A semiconductor integrated circuit device according to claim 1, further comprising third semiconductor regions of the first conductivity type, formed beneath the source regions and a second portion of the drain regions, other than said first portion, of said first and second MISFETs, the third semiconductor regions having a higher impurity concentration than that of said first semiconductor region and being provided in self-alignment with the gates of said first and second MISFETs.

5. A semiconductor integrated circuit device according to claim 1, further comprising:

two switch MISFETs interposed between the drain regions of said first and second MISFETs, respectively, and a pair of data lines, wherein at least one of the gates of said first and second MISFETs is connected directly with the source or drain region of one of said switch MISFETs through second contact holes which are formed in gate insulating films of said switch MISFETs; and a fourth semiconductor region of the first conductivity type formed beneath the source or drain region of one of said switch MISFETs to have substantially the same shape as that of said second contact holes.

6. A semiconductor integrated circuit device comprising:
   a first semiconductor region of first conductivity type formed in a semiconductor substrate;
   first and second MISFETs formed in said first semiconductor region and each having a gate insulating film, a gate, and source and drain regions of second conductivity type, the gates of said first and second MISFETs being connected directly with the drain regions of said second and first MISFETs, respectively, through contact holes formed in said gate insulating films thereby to construct a flip-flop circuit of a memory cell;
   second semiconductor regions of the first conductivity type formed beneath a portion of said drain regions to have substantially similar shapes as those of said contact holes and having a higher impurity concentration than that of said first semiconductor region; and
   third semiconductor regions of the first conductivity type formed beneath portions of said drain regions other than the portions of the drain regions beneath which said second semiconductor regions are formed, and having a higher impurity concentration than that of said first semiconductor region, wherein said second semiconductor regions are deeper than said third semiconductor regions, and said second and third semiconductor regions are in contact with each other.

7. A semiconductor integrated circuit device according to claim 6, wherein said first and second conductivity types are p-type and n-type, respectively, wherein the semiconductor substrate is of n-type conductivity, and wherein said first semiconductor region is a p-type well region formed in the n-type semiconductor substrate.

8. A semiconductor integrated circuit device according to claim 7, further comprising two resistor elements connected between the drain regions of said first and second MISFETs, respectively, and a power source potential, for providing load elements of the flip-flop circuit of said memory cell.

9. A semiconductor integrated circuit device according to claim 8, wherein said two resistor elements are formed of polycrystalline silicon.

10. A semiconductor integrated circuit device according to claim 6, wherein the third semiconductor regions are in contact with the drain regions.

11. A semiconductor integrated circuit device according to claim 6, wherein each of the first and second MISFETs include a sub-region provided in the first semiconductor region, beneath the respective gates, in which a channel of the respective first and second MISFETs is to be formed, and wherein said third semiconductor regions do not reach said sub-region.

12. A semiconductor integrated circuit device according to claim 6, wherein the drain regions of the first and second MISFETs include ions, as a conductivity-determining impurity, that have a smaller diffusion coefficient than a diffusion coefficient of conductivity-determining impurity ions of the third semiconductor regions.

13. A semiconductor integrated circuit device according to claim 12, wherein impurity ions of the third semiconductor regions are boron ions, and the impurity ions of the drain regions of the first and second MISFETs are arsenic ions.

14. A semiconductor integrated circuit device according to claim 6, wherein the second and third semiconductor regions have substantially the same impurity concentrations.

15. A semiconductor integrated circuit device according to claim 6, wherein each of the source and drain regions of the first and second MISFETs include a relatively low impurity concentration sub-region and a relatively high impurity concentration sub-region, the relatively low impurity concentration sub-regions being closer to the respective gate, and wherein the third semiconductor regions extend beneath both the relatively low impurity concentration sub-region and the relatively high impurity concentration sub-region of the drain regions of the first and second MISFETs.

16. A semiconductor integrated circuit device according to claim 6, wherein the second semiconductor regions are respectively beneath the contact holes, and have a similar shape as a respective contact hole.

17. A semiconductor integrated circuit device comprising:
   a first semiconductor region of first conductivity type formed in a semiconductor substrate;
   first and second MISFETs formed in said first semiconductor region and each having a gate insulating film, a gate, and source and drain regions of second conductivity type, the gates of said first and second MISFETs being connected directly with the drain regions of said second and first MISFETs, respectively, at a first portion of said drain regions thereby to construct a flip-flop circuit of a memory cell;
   second semiconductor regions of the first conductivity type formed below said first portion of said drain regions, and having a higher impurity concentration than that of said first semiconductor region; and
   third semiconductor regions of the first conductivity type formed below a second portion of said drain regions other than said first portion, and having a higher impurity concentration than that of said first semiconductor region, wherein said second semiconductor regions are deeper than said third semiconductor regions, and said second and third semiconductor regions are in contact with each other.

18. A semiconductor integrated circuit device according to claim 17, wherein said first and second conductivity types are p-type and n-type, respectively, wherein the semiconductor substrate if of n-type conductivity, and wherein said first semiconductor region is a p-type well region formed in the n-type semiconductor substrate.

19. A semiconductor integrated circuit device according to claim 18, further comprising two resistor elements connected between the drain regions of said first and second MISFETs, respectively, and a power source potential, for providing load elements of the flip-flop circuit of said memory cell.

20. A semiconductor integrated circuit device according to claim 19, wherein said two resistor elements are formed of polycrystalline silicon.

21. A semiconductor integrated circuit device according to claim 20, wherein said gates of said first and second MISFETs are connected to said drain regions of said second and first MISFETs through contact holes formed in said gate insulating films.

22. A semiconductor integrated circuit device according to claim 21, wherein the shape of said contact holes are similar to those of said second semiconductor regions.

23. A semiconductor integrated circuit device according to claim 22, wherein said second semiconductor regions are provided beneath the contact holes.

24. A semiconductor integrated circuit device according to claim 21, wherein said second semiconductor regions are provided beneath the contact holes.

25. A semiconductor integrated circuit device according to claim 1, wherein said second semiconductor regions are formed directly in contact with said drains.

26. A semiconductor integrated circuit device according to claim 17, wherein each of the first and second MISFETs include a sub-region provided in the first semiconductor region, beneath the respective gates, in which a channel of the respective first and second MISFETs is to be formed, and wherein said third semiconductor regions do not reach said sub-region.

27. A semiconductor integrated circuit device according to claim 4, wherein the first and second MISFETs include regions, beneath the respective gates, in which channels are to be formed, and wherein said third semiconductor regions do not extend beneath said regions, beneath the respective gates, in which the channels are to be formed.

28. A semiconductor integrated circuit device according to claim 27, wherein said second semiconductor regions do not extend beneath said regions, beneath the respective gates, in which the channels are to be formed.

29. A semiconductor integrated circuit device according to claim 1, wherein the drain regions of the first and second MISFETs include ions, as a conductivity-determining impurity, that have a smaller diffusion coefficient than a diffusion coefficient of conductivity-determining impurity ions of the third semiconductor regions.

30. A semiconductor integrated circuit device according to claim 4, wherein the third semiconductor regions are formed to be integral with the second semiconductor regions.

31. A semiconductor integrated circuit device according to claim 1, wherein the first and second MISFETs include regions, beneath the respective gates, in which channels are to be formed, and wherein said second semiconductor regions do not extend beneath said regions, beneath the respective gates, in which the channels are to be formed.

32. A semiconductor integrated circuit device having memory cells with a flip-flop circuit, comprising:
a first semiconductor region of first conductivity type formed in a semiconductor substrate;
a first insulating film having first and second holes, on said first semiconductor region;
a second semiconductor region of second conductivity type at said first hole, and a third semiconductor region of second conductivity type;
a first MISFET having a first gate electrode, and first source and drain regions of second conductivity type, and a second MISFET having a second gate electrode, and second source and drain regions of second conductivity type, said first gate electrode being on said first insulating film and connected to said second drain region and said second gate electrode being connected to said second semiconductor region and extending into said first hole, and wherein said first drain region is contiguous to said semiconductor region;
a fourth semiconductor region of first conductivity type formed below a portion of said first drain region, and having a higher impurity concentration than that of said first semiconductor region; and
a fifth semiconductor region of first conductivity type formed below said second semiconductor region, and having a higher impurity concentration than that of said first semiconductor region, said fifth semiconductor region extending deeper than said fourth semiconductor region.

33. A semiconductor integrated circuit device according to claim 32, wherein said first and second conductivity types are p-type and n-type, respectively, wherein said semiconductor substrate is of n-type conductivity, and wherein said first semiconductor region is a p-type well region formed in the n-type semiconductor substrate.

34. A semiconductor integrated circuit device according to claim 33, further comprising two resistor elements connected to said first and second drain regions, respectively, and connected to a power source potential, for providing load elements of the flip-flop circuit of said memory cells.

35. A semiconductor integrated circuit device according to claim 32, wherein said fourth semiconductor region of the first conductivity type is formed in self-alignment with said first and second gate electrodes of said first and second MISFETs.

36. A semiconductor integrated circuit device according to claim 32, further comprising:
a first switching MISFET interposed between said first drain region and one of a pair of data lines; and
a second switching MISFET interposed between said second drain region and the other of said pair of data lines.

37. A semiconductor integrated circuit device according to claim 34, wherein said two resistor elements comprise polycrystalline silicon.

38. A semiconductor integrated circuit device according to claim 32, wherein as shape in plan view of said first hole is similar to that in plan view of said fifth semiconductor region.

39. A semiconductor integrated circuit device according to claim 32, wherein said fourth semiconductor region is contiguous to said fifth semiconductor region.

* * * * *